(12) United States Patent
Kohmura et al.

(10) Patent No.: US 11,137,677 B2
(45) Date of Patent: Oct. 5, 2021

(54) PELLICLE, EXPOSURE ORIGINAL PLATE, EXPOSURE DEVICE, AND SEMICONDUCTOR DEVICE MANUFACTURING METHOD

(71) Applicant: Mitsui Chemicals, Inc., Tokyo (JP)

(72) Inventors: Kazuo Kohmura, Chiba (JP); Yosuke Ono, Sodegaura (JP); Atsushi Okubo, Itabashi (JP); Daiki Taneichi, Chiba (JP); Hisako Ishikawa, Ichihara (JP); Tsuneaki Biyajima, Otake (JP)

(73) Assignee: MITSUI CHEMICALS, INC., Tokyo (JP)

(*) Notice: Subject to any disclaimer, the term of this patent is extended or adjusted under 35 U.S.C. 154(b) by 273 days.

(21) Appl. No.: 16/535,183

(22) Filed: Aug. 8, 2019

(65) Prior Publication Data

US 2020/0064729 A1    Feb. 27, 2020

Related U.S. Application Data

(63) Continuation of application No. PCT/JP2018/004726, filed on Feb. 9, 2018.

(30) Foreign Application Priority Data

Feb. 17, 2017    (JP) .............................. JP2017-027742

(51) Int. Cl.
*G03F 1/64* (2012.01)
*G03F 7/20* (2006.01)
*G03F 1/24* (2012.01)
*G03F 1/62* (2012.01)

(52) U.S. Cl.
CPC .................. *G03F 1/64* (2013.01); *G03F 1/24* (2013.01); *G03F 1/62* (2013.01); *G03F 7/2004* (2013.01)

(58) Field of Classification Search
CPC ..... G03F 1/62; G03F 1/64; G03F 1/24; G03F 7/2004
USPC .......................................................... 430/5
See application file for complete search history.

(56) References Cited

U.S. PATENT DOCUMENTS

| 5,365,330 A | 11/1994 | Hagiwara |
| 2007/0287074 A1 | 12/2007 | Pas |
| 2017/0184956 A1 | 6/2017 | Kohmura et al. |
| 2017/0184957 A1 | 6/2017 | Kohmura et al. |
| 2017/0192349 A1 | 7/2017 | Kohmura et al. |

FOREIGN PATENT DOCUMENTS

| JP | H04-291347 A | 10/1992 |
| JP | H04-299820 A | 10/1992 |
| JP | H05-45710 U | 6/1993 |
| JP | H05-150443 A | 6/1993 |
| JP | H05-323585 A | 12/1993 |
| JP | H05-323586 A | 12/1993 |
| JP | H06-19124 A | 1/1994 |
| JP | 2001343738 A | 12/2001 |
| JP | 2002-182371 A | 6/2002 |
| JP | 2002-202587 A | 7/2002 |
| JP | 2009-169380 A | 7/2009 |
| JP | 2013097308 A | 5/2013 |
| WO | 2015166927 A1 | 11/2015 |
| WO | 2016/043292 A1 | 3/2016 |
| WO | 2016043301 A1 | 3/2016 |
| WO | 2016079051 A2 | 5/2016 |
| WO | 2016124536 A2 | 8/2016 |

OTHER PUBLICATIONS

International Search Report (PCT/ISA/210) and translation and Written Opinion (PCT/ISA/237) dated Apr. 17, 2018, by the Japanese Patent Office as the International Searching Authority for International Application No. PCT/JP2018/004726.

*Primary Examiner* — Christopher G Young
(74) *Attorney, Agent, or Firm* — Buchanan Ingersoll & Rooney PC

(57) ABSTRACT

A pellicle for EUV exposure that has a high transmittance to EUV light, causes little outgassing, and is not much contaminated, and a method for manufacturing the same are provided. A pellicle (100) includes a pellicle film (101); a support frame (103); and a first adhesive layer (109) provided at an end of the support frame, the end being opposite to an end on which the pellicle film is extended. The pellicle further includes an inorganic layer (111) on a side surface of the first adhesive layer, the side surface extending in a direction crossing a surface of the pellicle film, and the pellicle film being extended on the side surface. The inorganic layer has a mass absorption coefficient ($\mu_m$) in the range of $5 \times 10^3$ cm$^2$/g to $2 \times 10^5$ cm2/g.

13 Claims, 14 Drawing Sheets

PELLICLE, EXPOSURE ORIGINAL PLATE, EXPOSURE DEVICE, AND SEMICONDUCTOR DEVICE MANUFACTURING METHOD

CROSS REFERENCE TO RELATED APPLICATIONS

This application is based upon and claims the benefit of priority from the prior Japanese Patent Application No. 2017-027742, filed on Feb. 17, 2017, and PCT Application No. PCT/JP2018/004726, filed on Feb. 9, 2018, the entire contents of which are incorporated herein by reference.

FIELD

The present invention relates to a photomask or a reticle (hereinafter, collectively referred to as a "photomask" or "mask") usable to manufacture a semiconductor device or the like by a lithography technology, to a pellicle acting as a dust-preventive cover for the photomask that prevents dust or the like from adhering to the photomask, and the like. The present invention specifically relates to a pellicle for extreme ultraviolet (EUV) photolithography, a method for manufacturing the same, an exposure pattern plate using the same, and a method for manufacturing a semiconductor device.

BACKGROUND

A semiconductor element is manufactured by a method including a step referred to as lithography. In the step of lithography, an exposure device referred to as a scanner or a stepper is used to cause exposure light to be directed toward a mask having a circuit pattern drawn thereon, so that the circuit pattern is transferred to a semiconductor wafer coated with a photoresist. If, in this step, a foreign substance such as dust or the like adheres to the mask, the shadow of the foreign substance is transferred to the semiconductor wafer, and the circuit pattern is not transferred accurately. As a result, the semiconductor element may not operate normally and become defective.

In order to avoid such a situation, it is known that a pellicle including a frame and a pellicle film bonded to the frame is attached to the mask, so that a foreign substance such as dust or the like adheres to the pellicle film and is prevented from adhering to the mask. A focal point of exposure light of the exposure device is set on a surface of the mask and a surface of the semiconductor wafer, but is not set on a film surface of the pellicle film. Therefore, an image of the shadow of the foreign substance adhering to the pellicle film is not formed on the semiconductor wafer. For this reason, in the case where the foreign substance adheres to the pellicle film, the degree at which the transfer of the circuit pattern is disturbed is significantly lower than in the case where the foreign substance adheres to the mask. Thus, the ratio of defective products of the semiconductor element is significantly suppressed.

The pellicle film usable for the pellicle is required to transmit exposure light at a high transmittance, for the following reason. If the light transmittance of the pellicle film is low, the intensity of the exposure light from the mask having the circuit pattern formed thereon is decreased, and thus the photoresist formed on the semiconductor wafer is not sufficiently exposed to the exposure light.

So far, the wavelength of light used for lithography has been progressively shortened. As a next-generation lithography technology, EUV lithography is now being progressively developed. "EUV light" refers to light having a wavelength in a soft x-ray range or a vacuum ultraviolet range; more specifically, a light beam having a wavelength of about 13.5 nm±about 0.3 nm. In photolithography, the resolution limit of a pattern is about ½ of the exposure wavelength, and is considered to be about ¼ of the exposure wavelength even if an immersion method is used. Even if an immersion method is used with ArF laser light (wavelength: 193 nm), the exposure wavelength is expected to be about 45 nm at the minimum. In such a situation, EUV lithography is anticipated as a revolutionary technology that realizes significant reduction in size as compared with the conventional lithography.

As a method for connecting a pellicle for EUV exposure to a mask, use of the following method is being discussed: the pellicle is secured to the mask (mechanically) by a press spring attached to the pellicle and a pin called a "stud" that is set to the mask, via a catch provided commonly to the mask and the pellicle (WO2016/124536). For a pellicle not for EUV exposure, for example, for a pellicle for ArF, an adhesive is used to connect the pellicle to a mask.

SUMMARY

However, as a result of studies, the present inventors have found that in order to connect the pellicle to the mask by a pin, it may be needed to alleviate the troublesome process that may be needed during the attachment or the detachment of the pellicle. In addition, it has been found that because the connection is mechanical, tiny dust may be generated during the attachment or the detachment of the pellicle to or from the mask. It has also been found that because a gap of about 200 μm to about 300 μm is provided for ventilation between the mask and a pellicle frame, along the entire circumference of the pellicle frame, dust may enter through the gap. It has further been found that: when such dust adheres to the mask, the manufacturing efficiency of the semiconductor element is decreased, and therefore, the adhesion of the dust may need to be alleviated.

As a result of studies, the present inventors have found that when an adhesive for a pellicle not for EUV exposure is used, outgassing may occur.

In order to solve the above-described problems, the present invention has an object of providing a pellicle for EUV exposure that uses an adhesive but causes little outgassing, an exposure pattern plate, an exposure device, and a method for manufacturing a semiconductor device.

In order to solve the above-described problems, an embodiment according to the present invention provides a pellicle. The pellicle includes a pellicle film; a support frame supporting the pellicle film; and a first adhesive layer provided at an end of the support frame, the end being opposite to an end on which the pellicle film is extended. The pellicle further includes an inorganic layer on a side surface of the first adhesive layer, the side surface extending in a direction crossing a surface of the pellicle film, and the pellicle film being extended on the side surface. The inorganic layer has a mass absorption coefficient ($\mu_m$) in the range of $5 \times 10^3$ cm$^2$/g to $2 \times 10^5$ cm$^2$/g.

In an embodiment according to the present invention, the support frame may include a first frame connected with the pellicle film and a second frame connected with the first frame.

In an embodiment according to the present invention, the first frame and the second frame may be connected with each other by a second adhesive layer, and the pellicle may further include a second inorganic layer on either one of side surfaces of the second adhesive layer, the side surfaces extending in the direction crossing the surface of the pellicle film.

In an embodiment according to the present invention, the inorganic layer, in the case of having a thickness of 400 nm, may have a transmittance of 10% or lower to EUV (Extreme Ultraviolet) light having a wavelength of 13.5 nm.

In an embodiment according to the present invention, the inorganic layer may have a thickness of 50 nm or greater.

In an embodiment according to the present invention, the inorganic layer may be a metal layer.

In an embodiment according to the present invention, the metal layer may be formed of one metal material selected from the group consisting of aluminum, titanium, chromium, iron, nickel, copper, ruthenium, tantalum and gold; an alloy containing two or more elements selected from the group; or an oxide containing one element or two or more elements selected from the group.

In an embodiment according to the present invention, the pellicle may further include a protective layer on an end surface of the first adhesive layer, the end surface being opposite to an end surface on which the pellicle film is formed.

In an embodiment according to the present invention, an exposure pattern plate including a pattern plate; and the pellicle attached to a surface of the pattern plate, the surface having a pattern formed therein, may be provided.

In an embodiment according to the present invention, an exposure device including the exposure pattern plate may be provided.

In an embodiment according to the present invention, an exposure device may be provided. The exposure device includes a light source releasing exposure light; the exposure pattern plate; and an optical system guiding the exposure light released from the light source to the exposure pattern plate. The exposure pattern plate is located such that the exposure light released from the light source is transmitted through the pellicle film and is directed toward the pattern plate.

In an embodiment according to the present invention, the exposure light may be EUV light.

In an embodiment according to the present invention, a method for manufacturing a semiconductor device is provided. The method includes causing exposure light, released from a light source, to be transmitted through the pellicle film of the exposure pattern plate and to be directed toward, and reflected by, the pattern plate; and causing the exposure light, reflected by the pattern plate, to be transmitted through the pellicle film and to be directed toward a sensitive substrate, so that the sensitive substrate is exposed to the exposure light so as to have a shape of a pattern. The exposure light may be EUV light.

REFERENCE SIGNS LIST

Figure 1A:
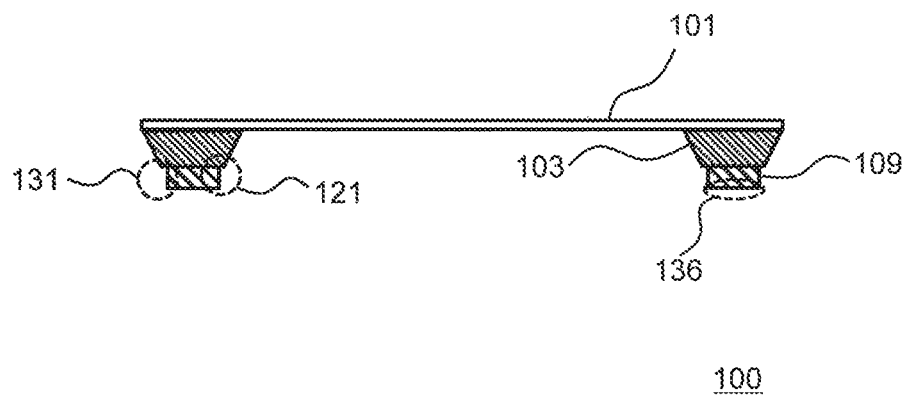
FIG. 1A is a schematic cross-sectional view of a pellicle according to an embodiment of the present invention.

100: pellicle; 101: pellicle film; 103: support frame; 104: first frame; 105: second adhesive layer; 107: second frame; 109: first adhesive layer; 111: inorganic layer; 113: inorganic layer; 115: inorganic layer; 117: inorganic layer; 120: protective layer; 121: first side surface; 131: second side surface; 136: first end surface; 136A: region; 136B: region; 136C: region; 136D: region; 136E: region; 141: side surface; 143: side surface; 180: exposure device; 181: exposure pattern plate; 182: light source; 183: illumination optical system; 184: pattern plate; 185: filter window; 186: filter window; 187: sensitive substrate; 188: projection optical system; 189: multi-layer mirror; 190: multi-layer mirror; 191: multi-layer mirror; 200: mask; 400: test device; 410: aluminum frame; 420: adhesive; 420A: surface; 420B: surface; 430: inorganic substance layer; 440: substrate; 450: thin plate; 452: through-hole; 454: through-hole; 456: through-hole; 460: film; 470: irradiation substrate; 1032: recessed portion; 1112: recessed portion.

DESCRIPTION OF EMBODIMENTS

Hereinafter, embodiments of the present invention will be described with reference to FIG. 1A to FIG. 14. The present invention may be carried out in various forms, and is not to be construed as being limited to any of the following embodiments. In the drawings, components may be shown schematically regarding the width, thickness, shape and the like, instead of being shown in accordance with the actual sizes, for the sake of clearer illustration. The drawings merely show examples and do not limit the interpretations of the present invention in any way. In the specification and the drawings, components that have substantially the same functions as those described before with reference to a previous drawing(s) bear the identical reference signs thereto, and detailed descriptions thereof may be omitted.

[Definitions]

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

In this specification, "EUV light" refers to light having a wavelength of 5 nm or longer and 30 nm or shorter. It is preferred that the wavelength of the EUV light is 5 nm or longer and 14 nm or shorter.

In this specification, a "pellicle film" refers to a thin film usable for a pellicle. A "pellicle" is an assembly of a pellicle film and a support frame that is provided on one surface of the pellicle film and supports the pellicle film. The support frame includes at least a first frame connected with the pellicle film. The support frame may further include a second frame connected with the first frame.

In this specification, a step of removing a part of the substrate while leaving the pellicle film will be referred to as "back-etching". In this specification, a step of etching the substrate from a rear surface thereof (surface of the substrate that is opposite to the surface having the pellicle film formed thereon) is shown as an example of back-etching.

In this specification, a "first adhesive layer" refers to an "adhesive layer that sets a pellicle to a mask". The "adhesive layer that sets a pellicle to a mask" refers to an adhesive provided at an end of the support frame of the pellicle that is opposite to an end on which the pellicle film is extended. The adhesive layer is used to connect the mask and the pellicle to each other.

The first adhesive layer of the pellicle has two side surfaces and an end surface, which are respectively a first side surface, a second side surface and a first end surface. In this specification, a "surface" is not limited to a flat surface, but encompasses a curved surface. Each of the first side surface, the second side surface and the first end surface is not limited to a flat surface but may be a curved surface.

In this specification, the first side surface of the first adhesive layer is a side surface of the first adhesive layer which extends in a direction crossing a surface of the pellicle film and on which the pellicle is extended.

In this specification, the second side surface of the first adhesive layer is a side surface of the first adhesive layer which extends in the direction crossing the surface of the pellicle film and is opposite to the side surface on which the pellicle is extended.

In this specification, the first end surface of the first adhesive layer is a surface of the first adhesive layer that is generally parallel to the surface of the pellicle film and is opposite to a surface on which the pellicle film is formed.

In this specification, a "second adhesive layer" refers to a layer connecting the first frame and the second frame to each other.

In this specification, an "adhesive" used for the adhesive layer encompasses a pressure-sensitive adhesive as well as an adhesive.

[Problems of the Conventional Art Found in Relation with the Present Invention]

As a method for connecting a pellicle for EUV exposure to a mask, use of the following method is being discussed: the pellicle is secured to the mask (mechanically) by a press spring attached to the pellicle and a pin called a "stud" that is set to the mask, via a catch provided commonly to the mask and the pellicle. However, with this method, it may be required to alleviate the troublesome process that may be needed during the attachment or the detachment of the pellicle. In addition, it may be required to suppress dust, which is generated by vibration or the like during the attachment or the detachment, from adhering to a surface of the mask as a foreign substance. In the case where a gap is provided for ventilation between the mask and the pellicle frame, it may be required to suppress a foreign substance, entering through the gap, from adhering to the surface of the mask. In the meantime, as a method for closing the gap with an adhesive to eliminate a route by which the foreign substance enters the inside of the pellicle, it has conventionally been considered to use an adhesive for the pellicle that is used in the case where an ArF laser is used. However, the present inventors have found that because exposure to light is performed in vacuum in EUV photolithography, outgassing easily occurs from the adhesive. In addition, the present inventors have sequentially found that gas generated by the outgassing from the adhesive is deposited as a carbon component on an area of the surface of the mask that is to be irradiated with the EUV light and thus causes contamination (decrease in the reflectance of the mask), and that the EUV light scattering on the surface of the mask hits the adhesive to damage the adhesive, and as a result, further outgassing occurs.

When the EUV light directly hits the adhesive layer, the adhesive layer is damaged to cause outgassing. After the first time, namely, the second time and thereafter when the EUV light hits the adhesive layer, the amount of gas generated by outgassing is decreased. However, the area of the adhesive layer that is damaged by the EUV light loses flexibility thereof and thus becomes brittle, which may cause generation of a foreign substance.

In such a situation, an embodiment described below has objects of (1) suppressing outgassing from being caused from the adhesive in a vacuum state where no EUV light is directed; (2) suppressing contamination from being caused in an area, of a space formed by the mask and the pellicle, that is irradiated with the EUV light; and (3) improving the tolerance of the adhesive to the EUV light directed thereto.

[Pellicle 100]

With reference to FIG. 1A to FIG. 5B, a pellicle according to an embodiment of the present invention will be described. As a premise, the pellicle 100 usable in the present invention is a pellicle for EUV photolithography. There is no specific limitation on a pellicle film for EUV photolithography usable for the present invention. For example, a pellicle film 101 (SiN, carbon-based film (e.g., graphene film, film of carbon nanotube formed by spin-coating, carbon nanosheet, or the like), polysilicon, or a stack body including a plurality of layers formed of such a material) is formed on a substrate (e.g., silicon wafer, sapphire, silicon carbide, or the like) by a method such as CVD (Chemical Vapor Deposition) (e.g., LP-CVD film formation, PE-CVD film formation, or the like), sputtering film formation or the like. Then, the substrate is etched (back-etched) from the side of the substrate such that the pellicle film is exposed. In this manner, the pellicle film 101 is manufactured.

Figure 3A:
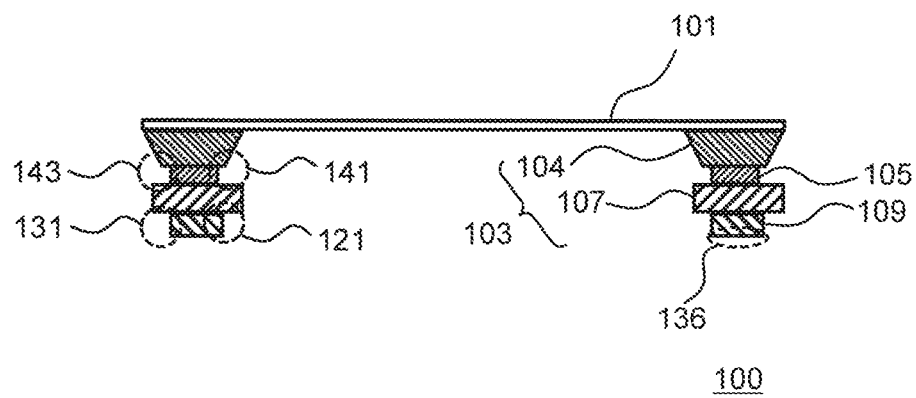
FIG. 3A is a schematic cross-sectional view of a pellicle according to an embodiment of the present invention.

In this step, etching is performed such that the substrate is left in a frame shape, so that the remaining frame is usable as a support frame 103 of the pellicle (FIG. 1A). The support frame 103 is provided on one surface of the pellicle film 101, and supports the pellicle film 101. Instead of performing etching such that the substrate is left in a frame shape and using the remaining frame as the support frame 103, another support frame may be prepared to secure the pellicle film 101 and the support frame 103 to each other. There is no specific limitation on the method for securing the pellicle film 101 to the support frame 103. The pellicle film 101 may be directly bonded to the support frame 103; the pellicle film 101 may be bonded to the support frame 103 via a film adhesive layer provided on one end surface of the support frame 103; or a mechanical securing method or an attractive force of a magnet or the like may be used to secure the pellicle film 101 and the support frame 103 to each other. The frame remaining after the etching performed on the substrate may be used as a first frame 104 to be connected with the pellicle film 101, and a second frame 107 formed of aluminum or the like may be connected with the first frame 104 to form the support frame 103 (FIG. 3A). Namely, the support frame 103 may include, as the frame, only the first frame 104 to be connected with the pellicle film 101, or may also include the second frame 107 to be connected with the first frame 104.

From the point of view of preventing adhesion of a foreign substance to the pellicle film 101 during the manufacturing of the pellicle, it is preferred that the support frame 103 is formed by etching the substrate such that the substrate is left as the first frame 104. It is preferred that the support frame 103 includes the second frame 107 from the point of view of increasing the strength of the support frame 103. From the point of view of increasing the strength of the support frame 103 while preventing adhesion of a foreign substance to the pellicle film 101, it is preferred that the support frame 103 includes the first frame 104 formed by etching the substrate such that the substrate is left in a frame shape and also includes the second frame 107. There is no specific limitation on the material of the first frame 104. The material of the first frame 104 is preferably silicon, sapphire or silicon carbide, and is more preferably silicon. There is no specific limitation on the material of the second frame 107. From the point of view of providing both of lightweightness and strength, the material is preferably aluminum or an aluminum alloy (5000-type, 6000-type, 7000-type, etc.).

According to the present invention, a first adhesive layer 109 (FIG. 1A) is provided in order to connect the pellicle 100 manufactured in the above-described manner with a photomask. As described above, from the point of view of decreasing the amount of dust, it is not appropriate to adopt the technique of directing EUV light toward one side surface of the adhesive, before the pellicle is used, to generate gas in advance and thus to decrease the amount of gas generated by outgassing at the time of the use. A technique of decreasing the amount of gas generated by outgassing by prebaking or the like is not suitable from the point of view of decreasing the amount of dust.

[First Adhesive Layer 109]

According to the present invention, the first adhesive layer 109 (FIG. 1A), more specifically, a first side surface 121 (shown FIG. 1A) of the first adhesive layer 109 for setting of the pellicle 100 to the mask (not shown) is coated with a material having a low transmittance to EUV light (metal material, ceramic material or the like). The "adhesive layer for setting of the pellicle to the mask" refers to an adhesive provided at an end of the support frame of the pellicle that is opposite to an end on which the pellicle film is extended. The adhesive layer is used to connect the mask and the pellicle to each other. The first side surface 121 is the first side surface of the first adhesive layer defined above. The first side surface 121 may be referred to as a portion surrounded by the mask and the pellicle, or as one side surface of the first adhesive layer that forms a closed space enclosed by the mask and the pellicle when the pellicle is connected with the mask. It is desirable that a thickness of the first adhesive layer 109, namely, a length of the first adhesive layer 109 in a direction perpendicular to the film surface of the pellicle film 101, is 10 μm to 1 mm. In the case where, for example, the thickness of the first adhesive layer 109 is 10 μm or greater, the support frame 103 and the mask in contact with a first end surface 136 have a high adhesiveness. In the case where the thickness of the first adhesive layer 109 is 1 mm or less, the pellicle 100 has a high gas barrier property.

Figure 1B:
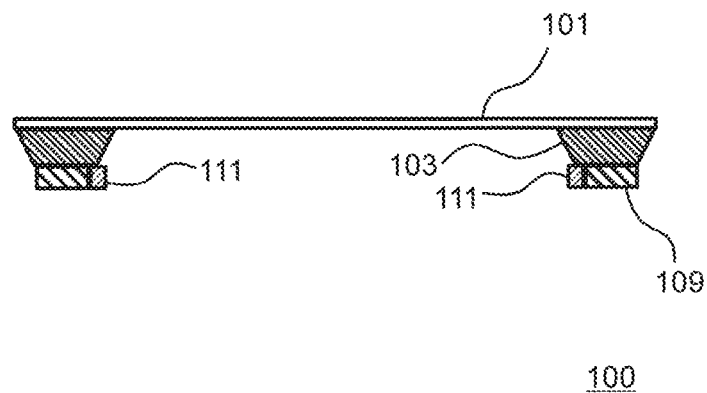
FIG. 1B is a schematic cross-sectional view of a pellicle according to an embodiment of the present invention.
Figure 2:
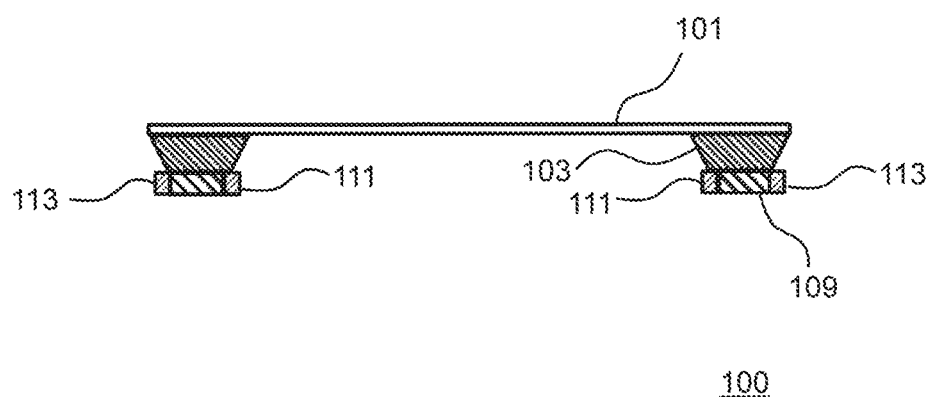
FIG. 2 is a schematic cross-sectional view of a pellicle according to an embodiment of the present invention.
Figure 3B:
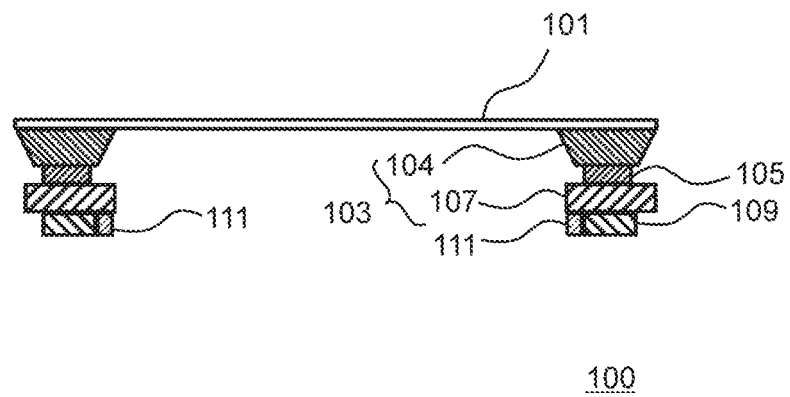
FIG. 3B is a schematic cross-sectional view of a pellicle according to an embodiment of the present invention.

FIG. 1A, FIG. 1B and FIG. 2 show a case where the pellicle 100 does not include the second frame 107 or a second adhesive layer 105 shown in FIG. 3A. FIG. 3A, FIG. 3B, FIG. 4A and FIG. 4B show a case where the pellicle 100 includes the second frame 107 and the second adhesive layer 105. An area of the first adhesive layer 109 that may be coated includes the first side surface 121 (FIG. 1A and FIG. 3A) defined above, a second side surface 131 (FIG. 1A and FIG. 3A) and the first end surface 136 (FIG. 1A and FIG. 3A). An area of the first adhesive layer 109 that needs to be coated is the first side surface 121. FIG. 1B and FIG. 3B schematically show a state where the first side surface 121 is coated with an inorganic layer 111.

[Second Side Surface 131]

Figure 4A:
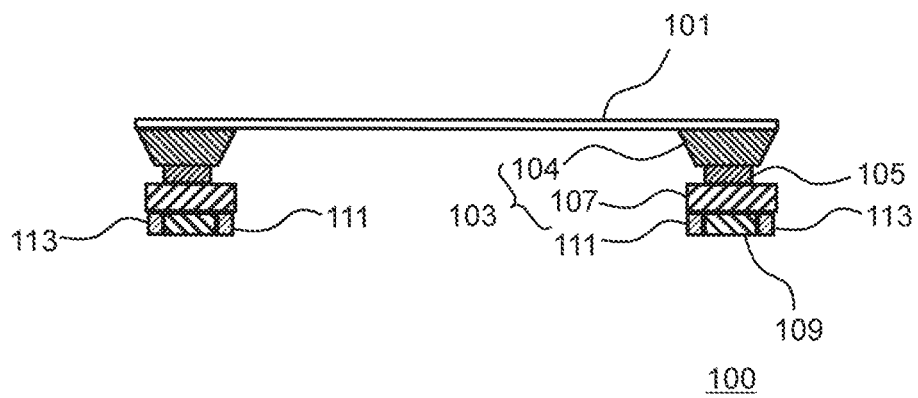
FIG. 4A is a schematic cross-sectional view of a pellicle according to an embodiment of the present invention.

The second side surface 131 of the first adhesive layer 109 may also be coated with the inorganic layer 111 (FIG. 2 and FIG. 4A). The second side surface 131 of the first adhesive layer 109 is not hit by EUV light scattering on the surface of the mask, and therefore, does not need to be coated. However, it is more preferred that the second side surface 131 is also coated in order to prevent gas, generated by outgassing from the second side surface 131 of the first adhesive layer 109, from contaminating an area other than the closed space surrounded by the mask and the pellicle 100, and also in order to prevent a part of such gas from entering the closed space surrounded by the mask and the pellicle 100 to contaminate the surface of the mask.

[First End Surface 136]

The first end surface 136 of the first adhesive layer 109 (shown in FIG. 1A and FIG. 3A) may be partially coated as long as the adhesive force thereof is maintained. The first end surface 136 of the first adhesive layer 109 is not hit by the EUV light, and therefore, does not need to be coated. However, it is more preferred that the first end surface 136 is coated in order to prevent gas, generated by outgassing from the adhesive, from contaminating an area other than the closed space surrounded by the mask and the pellicle 100.

Figure 4B:
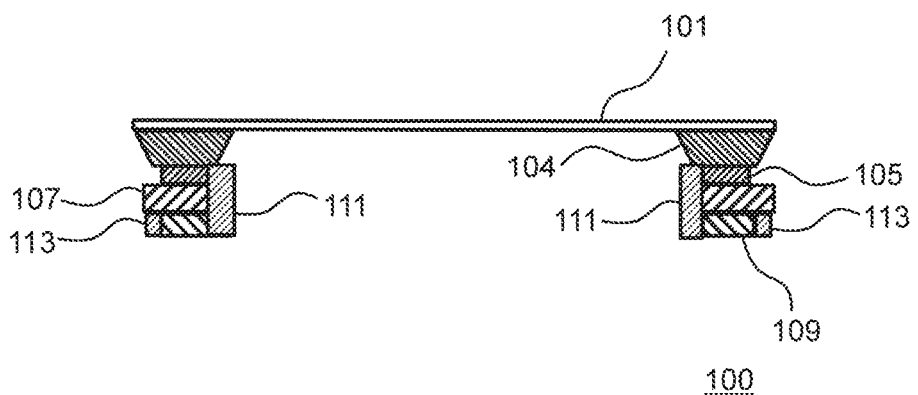
FIG. 4B is a schematic cross-sectional view of a pellicle according to an embodiment of the present invention.
Figure 5A:
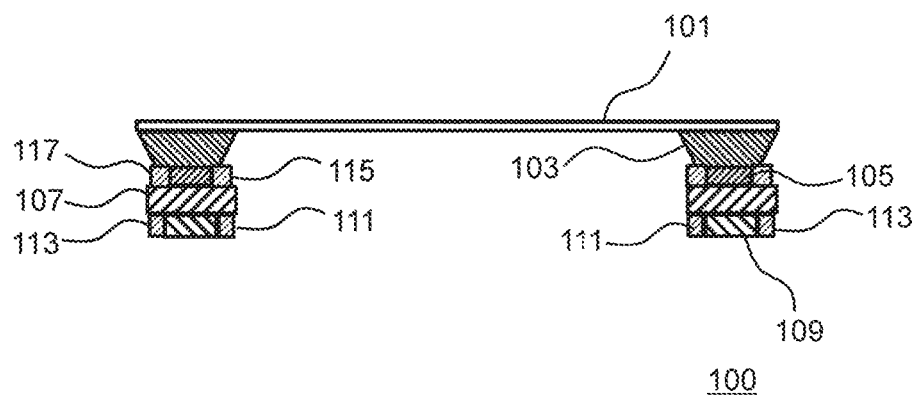
FIG. 5A is a schematic cross-sectional view of a pellicle according to an embodiment of the present invention.
Figure 5B:
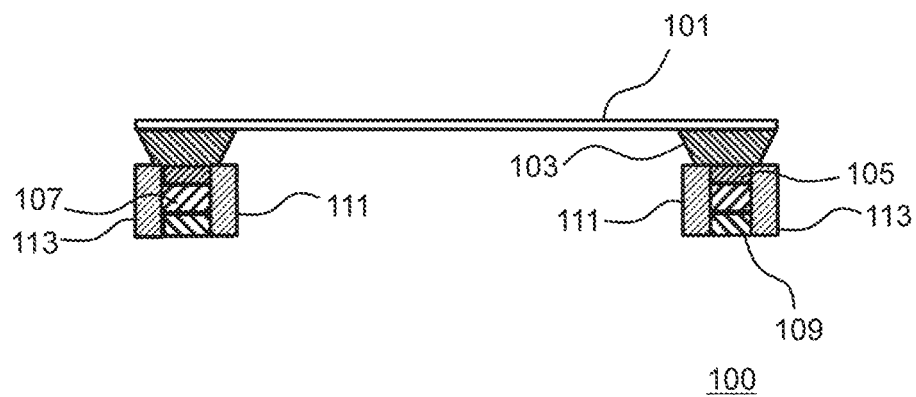
FIG. 5B is a schematic cross-sectional view of a pellicle according to an embodiment of the present invention.
Figure 6:
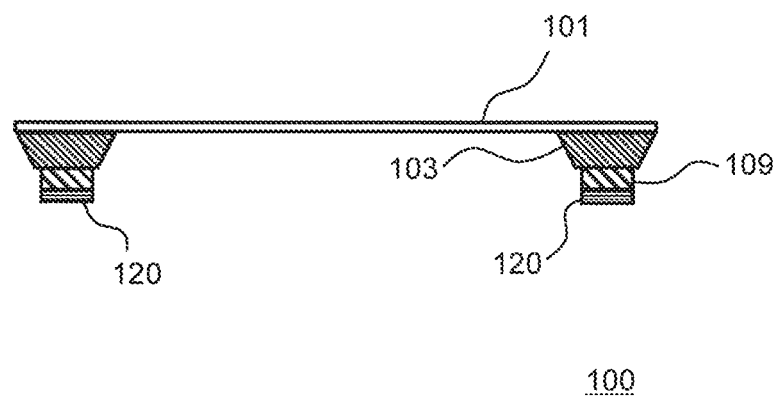
FIG. 6 is a schematic cross-sectional view of a pellicle according to an embodiment of the present invention.

Another adhesive layer may be coated. For example, a side surface 141 and/or a side surface 143 (FIG. 3A) of the second adhesive layer 105 defined above may be coated with an inorganic layer 115 and an inorganic layer 117 (FIG. 5A shows an example in which the side surface 141 and the side surface 143 are respectively coated with the inorganic layer 115 and the inorganic layer 117). The side surface 141 and the side surface 143 may be coated together with the second frame 107 by the inorganic layer 111 (FIG. 4B). The side surfaces of the first adhesive layer 109 and the side surfaces of the second adhesive layer 105 may be coated together with the second frame 107 by the inorganic layer 111 and the inorganic layer 113 (FIG. 5B). The second adhesive layer 105 bonds the first frame 104 connected with the pellicle film 101 and the second frame 107 (formed of aluminum or the like) to each other. It is more preferred that a side of the second adhesive layer 105 surrounded by the mask and the pellicle 100 and/or an external side of the adhesive layer 105 is coated with an inorganic layer. It is preferred that the inorganic layer 111 and the inorganic layer 113 are provided on the second frame 107 in order to prevent the EUV light from hitting the second adhesive layer 105.

The second adhesive layer 105 may be made thinner than the first adhesive layer 109, and the second adhesive layer 105 is at a height away from the mask and may be shadowed by the second frame 107. Therefore, the second adhesive layer 105 is not hit by the EUV light scattering on the surface of the mask, and thus does not need to be coated. Namely, it is not needed to provide an inorganic layer on the second adhesive layer 105.

[Material of the Inorganic Layer]

It is preferred that the inorganic layer fulfills the conditions of being tolerant to EUV light and having a transmittance of 10% or lower to EUV light. In the case of fulfilling these conditions, the inorganic layer does not cause much outgassing. It is more preferred that the inorganic layer is tolerant to hydrogen radical. It is preferred that the inorganic layer has a thickness of about 50 nm to about 1 μm.

The "transmittance of 10% or lower to EUV light" indicates that a predetermined inorganic layer having a thickness of 400 nm transmits 10% or lower of EUV light having a wavelength of 13.5 nm directed thereto.

The inorganic layer may be formed of a material having a low transmittance to EUV light (metal material, ceramic material, or the like). At the time of setting a pellicle to a mask, a force is applied to the adhesive layer in a direction of setting; and in an exposure device, a force is applied to the adhesive layer in a direction crossing the direction of setting (i.e., shear stress is applied). For these reasons, it is preferred that the inorganic layer is formed of a metal material in order to allow the inorganic layer to follow the shape of the adhesive layer.

Examples of method for coating the adhesive layer with the inorganic layer include vapor deposition, sputtering and the like, but the method is not limited to any one of these. Any method is usable as long as the inorganic layer is formed on a surface of the adhesive layer.

It is preferred that a metal material usable for the inorganic layer has a mass absorption coefficient ($\mu_m$) in the range of $5 \times 10^3$ cm$^2$/g to $2 \times 10^5$ cm$^2$/g. A technological significance of such numerical values will be described below.

It is preferred that a metal material usable for the inorganic layer is one selected from the group consisting of Al (aluminum), Ti (titanium), V (vanadium), Cr (chromium), Mn (manganese), Fe (iron), Co (cobalt), Ni (nickel), Cu (copper), Zn (zinc), Ga (gallium), Ge (germanium), Rb (rubidium), Sr (strontium), Y (yttrium), Zr (zirconium), Nb (niobium), Mo (molybdenum), Ru (ruthenium), Rh (rhodium), Pd (palladium), Ag (silver), Hf (hafnium), Ta (tantalum), W (tungsten), Pt (platinum), and Au (gold). The inorganic layer may be formed of an alloy containing two or more elements selected from the above group or an oxide containing two or more elements selected from the above group.

Among the above-listed metal materials, it is more preferred that the metal material usable for the inorganic layer is one selected from the group consisting of Al (aluminum), Ti (titanium), Cr (chromium), Fe (iron), Ni (nickel), Cu (copper), Ru (ruthenium), Ta (tantalum), and Au (gold).

The inorganic layer may be formed of an alloy containing two or more elements selected from the group consisting of Al (aluminum), Ti (titanium), Cr (chromium), Fe (iron), Ni (nickel), Cu (copper), Ru (ruthenium), Ta (tantalum), and Au (gold), or an oxide containing two or more elements selected from the above group.

The mass absorption coefficient mentioned above will be described. First, light transmittance T of the inorganic layer may be calculated as follows based on the thickness d of the inorganic layer, the density ρ of the inorganic layer, and the absorption coefficient μ of the inorganic layer.

As a premise, the transmittance T is defined by the following expression (1).

[Expression 1]

$$T \equiv \frac{I}{I_0} \quad (1)$$

In expression (1), I represents the intensity of the transmitted light, and $I_0$ represents the intensity of the incident light. The intensity I of the transmitted light, the intensity $I_0$ of the incident light, the thickness d of the coating, and the absorption coefficient μ of the inorganic layer have the relationship expressed by expression (2).

$$\mu = I_0 \exp(-\mu d) \quad (2)$$

In expression (2), the absorption coefficient μ is found as follows.

$$\mu = 2N r_0 \lambda f_2 \quad (3)$$

In the above expression, N represents the number of atoms in a unit volume, $r_0 = 2.82 \times 10^{-13}$ [cm] (classical electron radius), λ represents the wavelength, and $f_2$ represents the atomic scattering factor at the wavelength λ.

The absorption coefficient μ is expressed as the product of the mass absorption coefficient $\mu_m$ of the inorganic layer and the density ρ of the inorganic layer. $\mu_m$ may be expressed by the following expression.

$$\mu_m = 2N_A r_0 \lambda f_2 / A \quad (4)$$

$N_A$ represents the Avogadro constant, and A represents the atomic weight of an element contained in the inorganic layer.

Hereinafter, a case where the inorganic layer is formed of a plurality of elements will be discussed. In the case where the optical energy is larger than 30 eV and the photon energy is sufficiently far from the absorption edge of the atoms, the mass absorption coefficient $\mu_m$ does not depend on the binding state of atoms or the like. The photon energy of a wavelength of 13.5 nm is at or around 92.5 eV, and is also sufficiently far from the absorption edge of the atoms. Therefore, the mass absorption coefficient $\mu_m$ does not depend on the binding state of atoms of a compound contained in the inorganic layer. For this reason, the mass absorption coefficient $\mu_m$ of the compound contained in the inorganic layer is found by the following expression (5) based on the mass absorption coefficient $\mu_{mi}$ of each of elements (1, 2, . . . , i) contained in the inorganic layer and the mass fraction $W_i$ of each of the elements.

$$\mu_m = \mu_{m1} W_1 \times \mu_{m2} W_2 + \ldots \mu_{mi} W_i \quad (5)$$

$W_i$ is a value found by $W_i = n_i A_i / \Sigma n_i A_i$, and represents the mass fraction. $A_i$ represents the atomic weight of each element i, and $n_i$ represents the number of atoms of each element i.

For the mass absorption coefficient $\mu_{mi}$ of each element in expression (5) above and the atomic scattering factor $f_2$ of each element, the values in the following reference document provided by Henke et al. may be referred to (B. L. Henke, E. M. Gullikson, and J. C. Davis, "X-Ray Interactions: Photoabsorption, Scattering, Transmission, and Reflection at E=50-30,000 eV, Z=1-92" At. Data Nucl. Data Tables 54, 181 (1993). The latest version of these numerical figures are on http://www.cxro.lbl.gov/optical_constants/.)

If the absorption coefficient μ of the inorganic layer (or the mass absorption coefficient $\mu_m$ and the density ρ of the inorganic layer) and the thickness d of the inorganic layer are specified, the transmittance of the inorganic layer to light having a wavelength of 13.5 nm may be calculated based on expressions (1) and (2) above. The transmittance may be calculated in the website of the Center for X-Ray Optics of Lawrence Berkeley National Laboratory regarding the optical constant.

The absorption constant $\mu$ of each of the above-listed metal materials usable for the inorganic layer is as follows: Al (aluminum)=0.027 $nm^{-1}$, Cr (chromium)=0.036 $nm^{-1}$, Ni (nickel)=0.068 $nm^{-1}$, Ru (ruthenium)=0.017 $nm^{-1}$, and Ta (tantalum)=0.038 $nm^{-1}$. The mass absorption coefficient $\mu_m$ is as follows: Al (aluminum)=$1.0 \times 10^5$ $cm^2/g$, Cr (chromium)=$5.0 \times 10^4$ $cm^2/g$, Ni (nickel)=$7.6 \times 10^4$ $cm^2/g$, Ru (ruthenium)=$1.3 \times 10^4$ $cm^2/g$, and Ta (tantalum)=$2.3 \times 10^4$ $cm^2/g$. These metal materials all have a mass absorption coefficient ($\mu_m$) in the range of $5 \times 10^3$ to $2 \times 10^5$ $cm^2/g$.

[Adhesive]

As described above, the "adhesive" in this specification refers to an adhesive in a broad sense, and the concept of the "adhesive" encompasses a pressure-sensitive adhesive. Examples of the "adhesive" include acrylic resin adhesive, epoxy resin adhesive, polyimide resin adhesive, silicone resin adhesive, inorganic adhesive, two-sided tape, silicone resin pressure-sensitive adhesive, acrylic resin-based pressure-sensitive adhesive, polyolefin-based pressure-sensitive adhesive, and the like. Any type of adhesive is usable with no specific limitation.

An intermediate layer may be provided between the adhesive layer and the inorganic layer in order to, for example, prevent generation of cracks in the inorganic layer. The inorganic layer is stacked on the intermediate layer, and therefore, there is no specific limitation on the properties of the intermediate layer regarding the transmittance to EUV light or outgassing. The intermediate layer may be formed of, for example, parylene, polyimide, a ceramic material, a metal material or the like. The intermediate layer may be formed by a method such as vapor deposition, sputtering, CVD or the like.

A protective layer 120 (FIG. 6) may be formed on a surface of the first adhesive layer 109 that is opposite to the surface on which the pellicle film 101 is formed (the protective layer 120 may be formed on the first end surface 136). The protective layer 120 is applicable to any of the above-described embodiments, and any known component such as a release liner (also referred to as a release film, a separator or the like) is usable as the protective film 120 with no specific limitation. The provision of the protective layer 120 suppresses decrease in the pressure-sensitive adhesiveness of the adhesive layer during the transportation.

It is desirable that the pellicle 100 includes a ventilation mechanism that moves gas between the inside and the outside of the pellicle in a process of pressure reduction or venting to dissolve the pressure difference between the inside and the outside of the pellicle. The pellicle 100 may further include a foreign substance capturing function of suppressing a foreign substance from entering from the outside of the pellicle and adhering to the surface of the mask in the process of pressure reduction or venting. For example, a through-hole may be formed in the support frame 103 (the through-hole may be in the first frame 104 or the second frame 107) and a filter having a foreign substance capturing function may be bonded thereto.

EXAMPLES

<Amount of Gas Generated by Outgassing (in Vacuum) in the Case Where EUV Light is Not Directed>

Test Example 1

A water-containing styrene-based hotmelt adhesive (adhesive used for a pellicle for ArF laser light exposure) was applied, with a thickness of about 100 μm and a width of 1.5 to 2.0 mm, to a top surface of an aluminum frame having an outer size of 151 mm×118.5 mm, and an inner size of 147 mm×114.5 mm and a height of 1.6 mm to 2.0 mm. A masking film was bonded to a surface of the adhesive that was opposite to the surface in contact with the aluminum frame, with a width of about 0.5 mm from a center of the opposite surface. An exposed area of the adhesive was coated with nickel with a thickness of about 100 nm by magnetron sputtering. After the nickel coating, the masking film was released to expose a part of the adhesive, and the resultant assembly was bonded to a stainless steel substrate to provide a sample for evaluation. The obtained sample was inserted into a high vacuum chamber ($1 \times 10^{-6}$ Pa), and mass spectrometry was performed on gas generated by outgassing from the sample by use of a quadrupole mass spectrometer (QMS). The mass spectrometry was performed for a mass-to-charge ratio m/z in the range of 1 to 200.

The peak intensity derived from hydrocarbon chain at m/z in the range of 45 to 200, considered to cause contamination, was equal to the peak intensity measured regarding an aluminum frame with no adhesive applied thereto and also to the peak intensity measured regarding an empty high vacuum chamber with no sample being inserted. The total peak intensity at m/z in the range of 45 to 200 was about 1000.

It is considered that as a result of coating the adhesive, outgassing from the adhesive was suppressed at m/z in the range of 45 to 200.

Comparative Test Example 1

A sample substantially the same as that in test sample 1 described above was created except that the adhesive was not coated with nickel, and mass spectrometry was performed on the gas generated by outgassing (comparative test example 1). In comparative test example 1, peaks were observed for about 14 cycles at m/z in the range of 45 or higher. "14" is equal to the mass of $CH_2$, which is a unit of hydrocarbon. Therefore, it is considered that these peaks were derived from the gas that was generated by outgassing from the adhesive and derived from hydrocarbon. The total peak intensity at m/z in the range of 45 to 200 was about 8000. As a result of comparing test example 1 and comparative test example 1, it was found to be possible to decrease the amount of gas generated by outgassing from the adhesive.

<Tolerance to EUV>

Test Example 2

A water-containing styrene-based hotmelt adhesive was applied, with a thickness of about 100 μm, to a silicon wafer. A surface of the adhesive that was opposite to the surface in contact with the silicon wafer was coated with nickel with a thickness of about 100 nm by magnetron sputtering to provide a sample. The obtained sample was cut into a size of 1.5 cm×2 cm, and was irradiated with light (EUV light)

having a wavelength of 13.5 nm at a radiation intensity of about 500 mW/cm$^2$ for 15 minutes in a direction perpendicular to the nickel-coated surface by an EUV radiation device (NewSUBARU (name of facilities), BL-9, University of Hyogo). The change in the pressure inside the chamber was observed. The beam size was about 2 mm×about 4 mm.

After the irradiation with the EUV light, the pressure inside the chamber was raised by 1.7 µPa as compared with before the irradiation. This value of pressure rise matched, in an error range, the value of pressure rise in the case where the EUV light was directed with no sample being inserted, also the value of pressure rise in the case where the EUV light was directed toward a silicon wafer with no adhesive applied thereto. The area of the nickel-coated surface irradiated with the EUV light was not specifically discolored or deformed.

Comparative Test Example 2

A sample substantially the same as that in the example described above was created except that the adhesive was not coated with nickel, and was irradiated with EUV light (comparative test example 2). After the irradiation with the EUV light, the pressure inside the chamber was raised by 24 µPa as compared with before the irradiation. This value of pressure rise was higher by one or more digits than the value of pressure rise in the case where the EUV light was directed with no sample being inserted and than the value of pressure rise in the case where the EUV light was directed toward a silicon wafer with no adhesive applied thereto. It is considered that this pressure rise was derived from a decomposition product of the adhesive generated by the irradiation with the EUV light. The area of the surface of the adhesive irradiated with the EUV light was discolored to black, and a recessed portion was observed in the area. As a result of comparing test example 2 and comparative test example 2, the tolerance of the adhesive to irradiation with EUV light was found to be improved because the adhesive was not deteriorated (discolored) by the irradiation with the EUV light and outgassing was not caused.

<Evaluation on Adhesion of Contaminants>

Test Example 3

Figure 7:
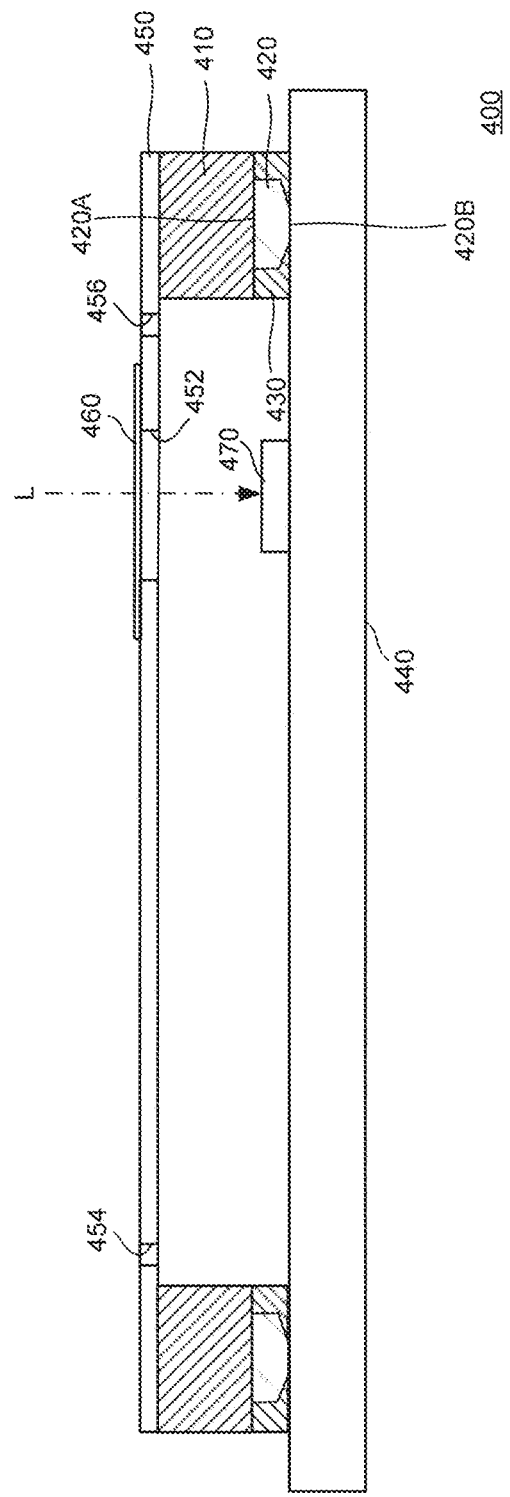
FIG. 7 is a schematic cross-sectional view a test device used for evaluation on adhesion of contaminants in test example 3.

FIG. 7 is a schematic cross-sectional view of a test device 400 used for an evaluation on adhesion of contaminants in test example 3. A water-containing styrene-based hotmelt adhesive 420 was applied, with a thickness of about 100 µm and a width of 1.5 to 2.0 mm, to one surface of an aluminum frame 410 having an outer size of 151 mm×118.5 mm, an inner size of 147 mm×114.5 mm and a height of 1.6 mm to 2.0 mm.

A masking film was bonded to a surface 420B of the adhesive 420 opposite to a surface 420A in contact with the aluminum frame 410, with a width of about 0.5 mm from a center of the surface 420B. An exposed area of the adhesive 420 was coated with nickel with a thickness of about 100 nm by magnetron sputtering to form an inorganic substance layer 430. After the nickel coating, the masking film was released to expose a part of the adhesive 420 to provide a sample for evaluation.

The sample was bonded, at the exposed area of the adhesive 420, to a stainless steel substrate 440. Next, the aluminum frame 410, and a stainless steel thin plate 450 having both of a through-hole 452 for providing a 50 nm-thick SiN film (also referred to as a "SiN self-supporting film") 460 and through-holes 454 and 456 for ventilation, were mechanically bound together by use of a screw and a press plate. The aluminum frame 410 and the thin plate 450 had outer circumferences of an equal size to each other. Next, the SiN film 460 held to a rectangular frame was mechanically bound to the thin plate 450 by use of a screw and a press plate.

In the closed space, an EUV irradiation substrate 470 including a silicon wafer and a layer of TaN, used as an absorber for an EUV mask, formed by sputtering on a surface of the silicon wafer was placed as a substrate to be irradiated with EUV light in order to observe the state of adhesion of contaminants.

A surface of the TaN layer of the EUV irradiation substrate 470 was irradiated with light (EUV light) having a wavelength of 13.5 nm through the SiN film 460 by the EUV radiation device (NewSUBARU (name of facilities), BL-9, University of Hyogo). The radiation intensity was about 110 mV/cm$^2$, and the radiation time was 135 minutes. The beam size was about 2 mm×about 4 mm. The SiN film 460 was square and had a size of 1 cm×1 cm. The frame for the SiN film 460 was square and had a size of 3 cm×3 cm.

The area of the EUV irradiation substrate 470 irradiated with the EUV light was not specifically discolored, and adhesion of carbon to the area was not observed in a Raman spectrum.

(Measurement of Thickness of a Contaminant Layer by Cross-Sectional TEM)

A thin piece of the cross-section of the area, of the EUV irradiation substrate, that was irradiated with the EUV light was created by use of a converged ion beam, and the thickness of a contaminant layer was directly observed by a transmission electron microscope (TEM). The thickness of the contaminant layer in the area irradiated with the EUV light was 2.9±0.9 nm. The area, of the EUV irradiation substrate 470, irradiated with the EUV light was subjected to XPS wide scan to calculate the abundance ratio of carbon. The abundance ratio of carbon was 65.0±5.2%. The carbon component is considered to have been generated due to stain in the device. Specifically, grease is used to move a stage on which the test device 400 is placed. Therefore, it is considered that a volatilized component of the grease was diffused into the inside of the pellicle and was changed to the contaminant.

Separately, the EUV irradiation substrate 470 was irradiated with EUV light in substantially the same manner as in test example 3 described above except that a sample created with no use of the adhesive 420 was mechanically bound to the stainless steel substrate 440, and the cross-section was observed with the TEM and was subjected to XPS measurement. The thickness of the contaminant layer was 2.7±1.1 nm, and the abundance ratio of carbon was 62.1±9.1%.

Comparative Test Example 3

A sample was created in substantially the same manner as in test example 3 described above except that the surface of the adhesive 420 was not coated with nickel (comparative test example 3), and was irradiated with EUV light. The area, of the EUV irradiation substrate, that was irradiated with the EUV light was discolored to black, and a peak derived from deposited carbon was observed in a Raman spectrum. A thin piece of the cross-section of the area, of the EUV irradiation substrate 470, irradiated with the EUV light was created by use of a converged ion beam, and the thickness of a contaminant layer was directly observed by the transmission electron microscope (TEM). The thickness of the contaminant layer in the area irradiated with the EUV light was 17.5±3.5 nm. The area, of the EUV irradiation substrate, irradiated with the EUV light was subjected to XPS wide scan to calculate the abundance ratio of carbon. The abundance ratio of carbon was 90.5±0.6%.

The thickness of the contaminant layer and the abundance ratio of carbon in test example 3 match, in an error range, those in the case where the adhesive 420 was not used. By contrast, in comparative test example 3, in which the adhesive was used but coating with nickel was not performed, the thickness of the contaminant layer and the abundance ratio of carbon were greater, which indicates that adhesion of the contaminants was not suppressed. As a result of comparing test example 3 and comparative test example 3, it was found to be possible to suppress that the adhesion of the contaminants caused by irradiation with EUV light.

Table 1 summarizes the results of test examples 1 to 3 and comparative test examples 1 to 3 described above. The samples used in test examples 1 to 3 have slightly different results from each other because the measurement methods are different, but are the same as each other in the sense that these test samples are of a pellicle coated with an inorganic layer. Therefore, these samples are collectively shown as "test examples". For the same reason, comparative test examples 1 to 3 are collectively shown as "comparative test examples".

TABLE 1

| | Sample | Adhesive Coating | Test examples Water-containing styrene-based Coated | Comparative test examples Water-containing styrene-based Not coated |
|---|---|---|---|---|
| 1 | Suppression of outgassing | QMS m/z 45-200 Total intensity | 1000 | 8000 |
| | | Evaluation results | ✓ | X |
| 2 | Tolerance to irradiation with EUV | Pressure rise during irradiation with EUV light | Not risen | Risen |
| | | Discoloration of area irradiated with EUV light | Not discolored | Discolored |
| | | Evaluation results | ✓ | X |
| 3 | Adhesion of contaminants | Discoloration of area irradiated with EUV light | Not discolored | Discolored |
| | | Raman spectrum (carbon peak) | Not observed | Observed |
| | | Thickness of contaminant layer (cross-sectional TEM) [nm] | 2.9 ± 0.9 | 17.5 ± 3.5 |
| | | XPS Carbon composition ratio [%] | 65.0 ± 5.2 | 90.5 ± 0.6 |
| | | Evaluation results | ✓ | X |

Based on Table 1, it is understood that nickel coating provides a significant difference in three points, specifically, suppression of outgassing in the case where the EUV light is not directed, tolerance to EUV light, and evaluation on the adhesion of contaminants. Based on such results of experiments, it is understood that a sufficient effect is provided even in the case where coating is performed with a metal material that is usable to coat the adhesive layer, that does not cause much outgassing, and that is not influenced by EUV light, for example, Al (aluminum), Cr (chromium), Ni (nickel), Ru (ruthenium), Ta (tantalum) or Au (gold). It is considered that coating with such a metal material provides the adhesive with tolerance to hydrogen radical, which is generated by irradiation with EUV light.

Hereinafter, examples of form in which the first end surface of the first adhesive layer described above is partially coated are shown.

[Other Examples of Vicinity Structure of the First Adhesive Layer 109 and the Support Frame 103]

Figure 8:
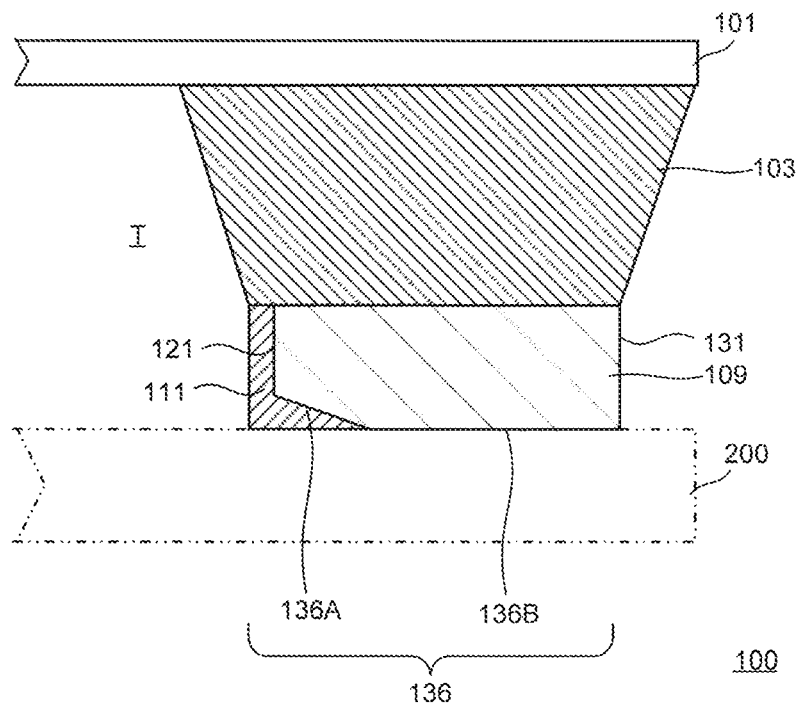
FIG. 8 is a schematic cross-sectional view of a pellicle according to an embodiment of the present invention.

FIG. 8 shows another example of vicinity structure of the first adhesive layer 109 and the support frame 103 of the pellicle 100. In this example, the inorganic layer 111 is in contact with at least a part of the first end surface 136 of the first adhesive layer 109 in addition to the first side surface 121. Specifically, the inorganic layer 111 is in contact with a region 136A, of the first end surface 136, adjacent to the first side surface 121. A region 136B, of the first end surface 136, adjacent to the region 136A is contact with the surface of the mask 200 beneath the first adhesive layer 109. The thickness of the inorganic layer 111, namely, the length of the inorganic layer 111 in a direction perpendicular to the film surface of the pellicle film 101 is shorter at a position closer to the region 136B than a position farther from the region 136B. The support frame 103 may further include the second frame. A form in the case where the second frame is included is as described above. In FIG. 8, "101" represents the pellicle frame, and "131" represents the second side surface.

Figure 9:
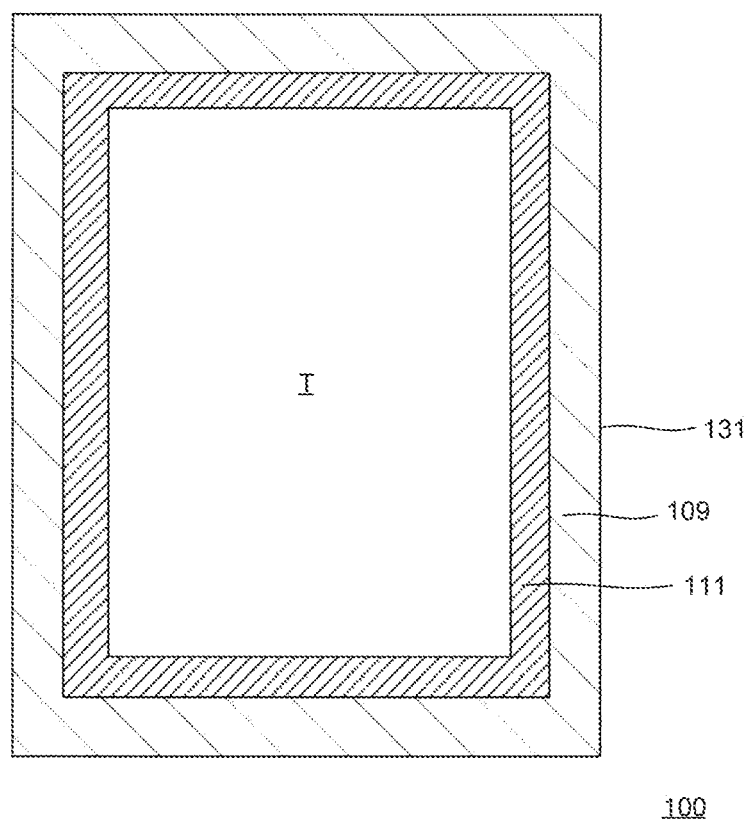
FIG. 9 is a schematic view of the pellicle according to the embodiment of the present invention as seen from below.

FIG. 9 is a view of the pellicle 100 shown in FIG. 8 as seen from below (i.e., view as seen in a direction perpendicular to the first end surface 136). FIG. 9 omits the support frame 103 and the pellicle film 101. The inorganic layer 111 is formed in a rectangular (encompassing "square") frame shape. The first adhesive layer 109 is formed in a rectangular (encompassing "square") frame shape along an outer circumference of the inorganic layer 111. With such a structure, an area T inner to the inorganic layer 111 is a closed space closed by the mask 200, the inorganic layer 111 (first adhesive layer 109), the support frame 103, and the pellicle film 101. In the example shown in FIG. 8 and FIG. 9, the method for forming the inorganic layer 111 may be, for example, a method of coating the first adhesive layer 109 with an inorganic material by, for example, magnetron sputtering while protecting the area 136B of the first adhesive layer 109 with a masking tape, and then releasing the masking tape.

Figure 10:
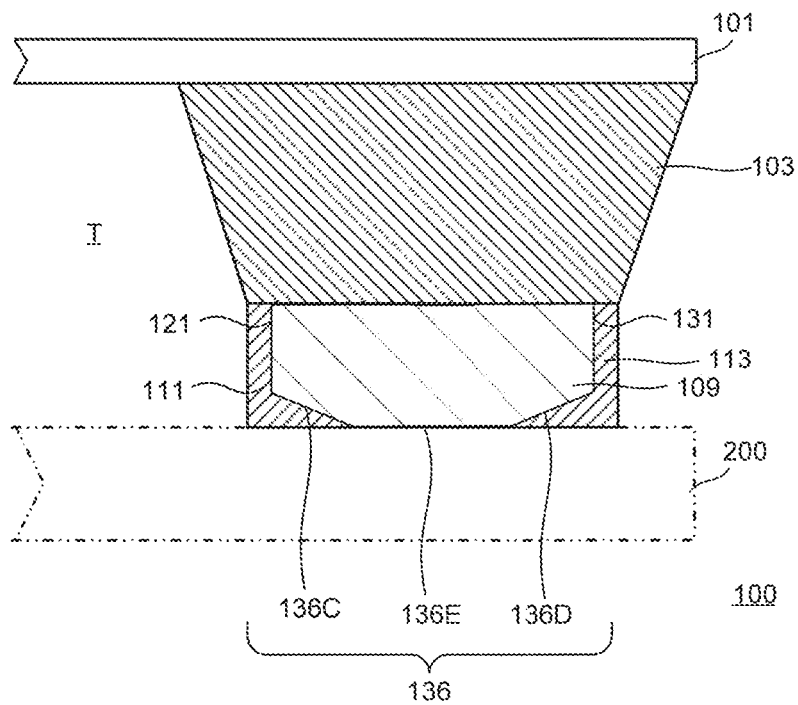
FIG. 10 is a schematic cross-sectional view of a pellicle according to an embodiment of the present invention.

FIG. 10 shows still another example of vicinity structure of the first adhesive layer 109 and the support frame 103 of the pellicle 100. In this example, the inorganic layer 111 is in contact with at least a part of the first end surface 136 of the first adhesive layer 109 in addition to the first side surface 121. Specifically, the inorganic layer 111 is in contact with a region 136C, of the first end surface 136, adjacent to the first side surface 121. The organic layer 113 is in contact with at least a part of the first end surface 136 of the first adhesive layer 109 in addition to the second side surface 131. Specifically, the inorganic layer 113 is in contact with a region 136D, of the first end surface 136, adjacent to the second side surface 131. A region 136E of the first end surface 136, that is located between the region 136C and the region 136D and is adjacent to the region 136C and the region 136D is in contact with the surface of the mask 200 beneath the first adhesive layer 109. The thickness of each the inorganic layer 111 and the inorganic layer 113, namely, the length of each of the inorganic layer 111 and the inorganic layer 113 in the direction perpendicular to the film surface of the pellicle film 101 is shorter at a position closer to the region 136E than at a position farther from the region 136E. The support frame 103 may further include the second frame. A form in the case where the second frame is included is as described above. In FIG. 10, "101" represents the pellicle frame.

Figure 11:
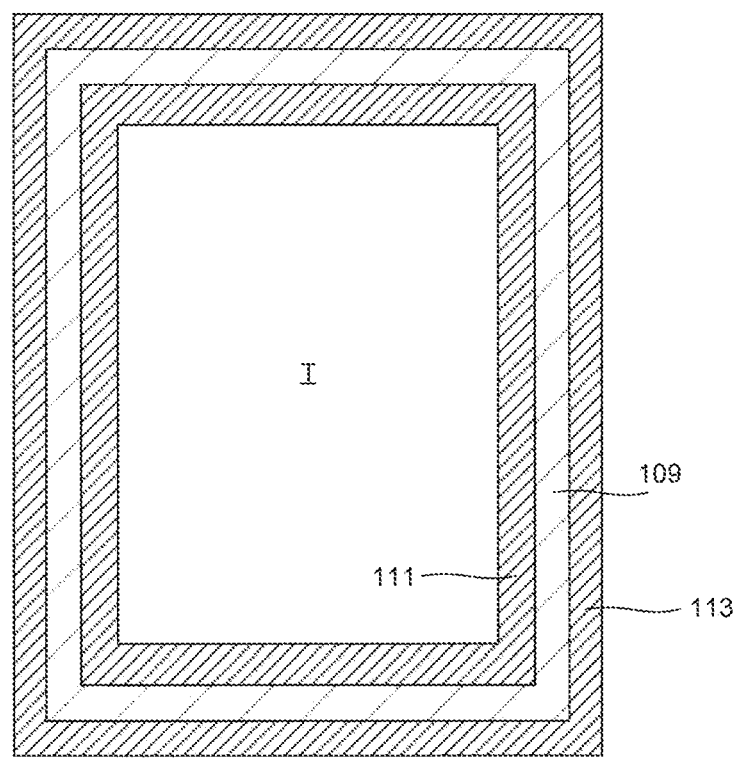
FIG. 11 is a schematic view of the pellicle according to the embodiment of the present invention as seen from below.

FIG. 11 is a view of the pellicle 100 shown in FIG. 10 as seen from below. FIG. 11 omits the support frame 103 and the pellicle film 101. The inorganic layer 111 and the inorganic layer 113 are each formed in a rectangular (encompassing "square") frame shape. The first adhesive layer 109 is held between the outer circumference of the inorganic layer 111 and an inner circumference of the inorganic layer 113, and is formed in a rectangular (encompassing "square") frame shape along the entirety of the outer circumference of the inorganic layer 111 and the inner circumference of the inorganic layer 113. With such a structure, the area T inner to the inorganic layer 111 is a closed space closed by the mask 200, the inorganic layer 111 (first adhesive layer 109), the support frame 103, and the pellicle film 101. In the example shown in FIG. 10 and FIG. 11, the method for forming the inorganic layer 111 may be, for example, a method of coating the first adhesive layer 109 with an inorganic material by, for example, magnetron sputtering while protecting the area 136E of the first adhesive layer 109 with a masking tape, and then releasing the masking tape. A specific example in which the inorganic layer 111 is formed by this method is shown in test example 3.

As described above, the inorganic layer 111 may be provided in a part of the area between the first adhesive layer 109 and the mask 200. The shape of each of the first adhesive layer 109 and the inorganic layer 111 shown in each of FIG. 8 to FIG. 11 is merely an example, and the first adhesive layer 109 and the inorganic layer 111 may each have any of various shape. The inorganic layer 111 may be provided in a part of the area between the first adhesive layer 109 and the support frame 103.

Figure 12:
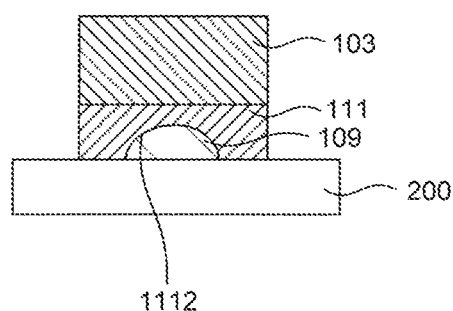
FIG. 12 is a schematic cross-sectional view of a pellicle having another structure.

FIG. 12 is a schematic cross-sectional view of a pellicle having still another structure. The present inventors examined the structure shown in FIG. 12, in which an end surface of the support frame 103 on which the first adhesive layer 109 is to be formed is entirely coated with the inorganic layer 111, a recessed portion 1112 is formed in the inorganic layer 111 on the side opposite to the support frame 103, and the recessed portion 1112 is filled with an adhesive to form the first adhesive layer 109. In this example, the recessed portion 1112 is semicircular. However, in this case, it is difficult to control the amount of the adhesive to be located in the recessed portion 1112. Therefore, the adhesive may overflow the recessed portion 1112 and as a result, it is made meaningless to coat the first adhesive layer 109 with the inorganic layer 111; or the amount of the adhesive may be too small to provide a sufficient adhesiveness between the inorganic layer 111 and the mask 200 and as a result, dust enters the inside and adheres to the surface of the mask 200. Therefore, with the structure in FIG. 12, outgassing may be required to be further suppressed, and adhesion of dust to the mask 200 may be required to be further suppressed.

Figure 13:
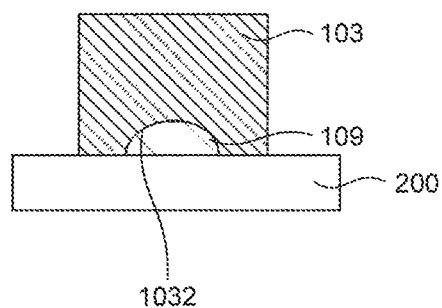
FIG. 13 is a schematic cross-sectional view of a pellicle having still another structure.

FIG. 13 is a schematic cross-sectional view of a pellicle having still another structure. The present inventors also examined the structure shown in FIG. 13. In this structure, a recessed portion 1032 is formed in an end surface of the support frame 103 on which the first adhesive layer 109 is to be formed, and the recessed portion 1032 is filled with an adhesive to form the first adhesive layer 109. In this example, the recessed portion 103 is semicircular. However, in this case, it is difficult to control the amount of the adhesive to be located in the recessed portion 1032. Therefore, the adhesive may overflow the recessed portion 1032 and as a result, a state substantially the same as that in the case where the first adhesive layer 109 is not coated with the inorganic layer 111 is provided; or the amount of the adhesive may be too small to provide a sufficient adhesiveness between the support frame 103 and the mask 200 and as a result, dust enters the inside and adheres to the surface of the mask 200. In addition, the EUV light is not blocked in the case where the support frame 103 is formed of a certain material. Therefore, with the structure in FIG. 13, outgassing may be required to be further suppressed, or adhesion of dust to the mask 200 may be required to be further suppressed.

[Exposure Pattern Plate]

An exposure pattern plate in this embodiment includes a pattern plate and the pellicle in this embodiment attached to the pattern plate. The exposure pattern plate in this embodiment includes the pellicle in this embodiment, and therefore, provides substantially the same effect as that of the pellicle in this embodiment.

The pattern plate may include a support substrate, a reflective layer stacked on the support substrate, and an absorbing layer formed on the reflective layer. The absorbing layer absorbs a part of the EUV light, and as a result, a desired image is formed on a sensitive substrate (e.g., a semiconductor substrate provided with a photoresist film). The reflective layer may be a multi-layer film of molybdenum (Mo) and silicon (Si). The absorbing layer may be formed of a material having a high absorbance of the EUV light or the like, such as chromium (Cr), tantalum nitride or the like.

[Exposure Device]

The exposure device in this embodiment includes the exposure pattern plate in this embodiment, and therefore, provides substantially the same effect as that of the exposure pattern plate in this embodiment.

The exposure device in this embodiment includes a light source releasing exposure light (preferably, EUV light or the like, more preferably EUV light; this is applicable to the following description), the exposure pattern plate in this embodiment, and an optical system guiding the exposure light released from the light source to the exposure pattern plate. It is preferred that the exposure pattern plate is located such that the exposure light released from the light source is transmitted through the pellicle film and is directed toward the pattern plate.

In this embodiment, a microscopic pattern (e.g., having a line width of 32 nm or less) may be formed by the EUV light or the like. In addition, even in the case where EUV light that may easily cause a resolution failure by a foreign substance is used, patterned exposure is performed in the state where the resolution failure by the foreign substance is suppressed.

[Method for Manufacturing a Semiconductor Device]

According to a method for manufacturing a semiconductor device in this embodiment, the exposure light released from the light source is caused to be transmitted through the pellicle film of the exposure pattern plate in this embodiment and thus to be directed toward, and reflected by, the exposure pattern plate, and the exposure light reflected by the pattern plate is caused to be transmitted through the pellicle film and thus to be directed toward the sensitive substrate. In this manner, the sensitive substrate is exposed to the exposure light so as to have a shape of a pattern.

According to the method for manufacturing the semiconductor device in this embodiment, even in the case where EUV light that may easily cause a resolution failure by a foreign substance is used, the resolution failure by the foreign substance in the resultant semiconductor device is suppressed.

Figure 14:
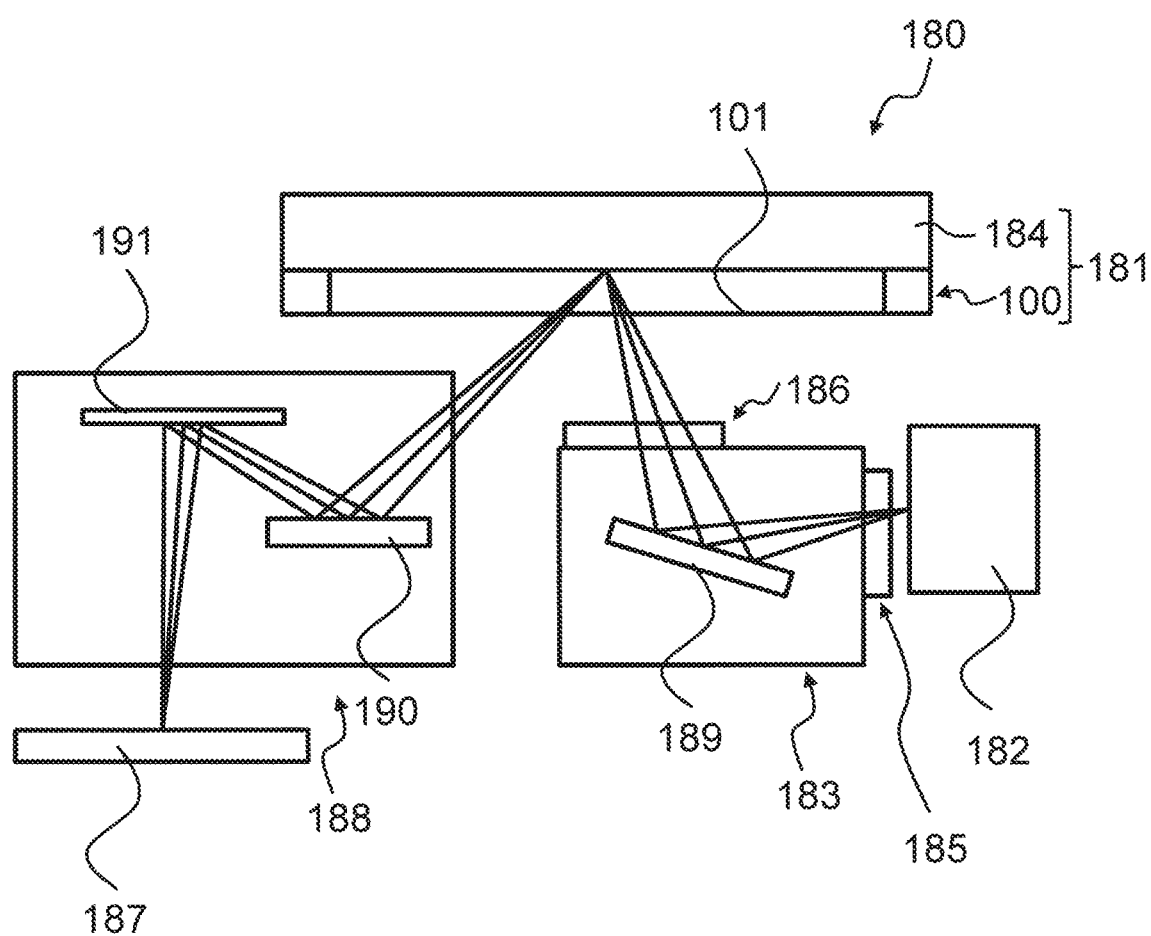
FIG. 14 is a schematic view of an exposure device according to an embodiment of the present invention.

FIG. 14 is a schematic cross-sectional view of an EUV exposure device 180, which is an example of exposure device in this embodiment.

As shown in FIG. 14, the EUV exposure device 180 includes a light source 182 releasing EUV light, an exposure pattern plate 181, which is an example of exposure pattern plate in this embodiment, and an illumination optical system 183 guiding the EUV light released from the light source 182 to the exposure pattern plate 181.

The exposure pattern plate 181 includes the pellicle 100, including the pellicle film 101 and the support frame 103, and a pattern plate 184. The exposure pattern plate 181 is located such that the EUV light released from the light source 182 is transmitted through the pellicle film 101 and is directed toward the pattern plate 184.

The plate 184 reflects the EUV light directed thereto such that the reflected EUV light has a shape of a pattern.

The pellicle film 101 and the pellicle 100 are respectively examples of the pellicle film and the pellicle in this embodiment.

The EUV exposure device 180 includes a filter window 185 provided between the light source 182 and the illumination optical system 183, and includes a filter window 186 provided between the illumination optical system 183 and the pattern plate 184.

The EUV exposure device 180 includes a projection optical system 188 guiding the EUV light, reflected by the pattern plate 184, to a sensitive substrate 187.

In the EUV exposure device 180, the EUV light reflected by the pattern plate 184 is guided onto the sensitive substrate 187 via the projection optical system 188, and the sensitive substrate 187 is exposed to the exposure light so as to have a shape of a pattern. The exposure with the EUV light is performed under a reduced pressure.

The EUV light source 182 releases the EUV light toward the illumination optical system 183.

The EUV light source 182 includes a target member, a pulsed laser light illuminator and the like. The target member is irradiated with pulsed laser light to generate plasma, so that the EUV light is generated. Where the target member is Xe, the generated EUV light has a wavelength of 13 nm to 14 nm. The light emitted by the EUV light source is not limited to having a wavelength in the range of 13 nm to 14 nm, and may have any wavelength suitable to the purpose within the range of 5 nm to 30 nm.

The illumination optical system 183 collects the light directed from the EUV light source 182, and then uniformizes the illuminance thereof and directs the light toward the pattern plate 184.

The illumination optical system 183 includes a plurality of multi-layer mirrors 189 that adjust the optical path of the EUV light, an optical integrator, and the like. The multi-layer mirrors each include, for example, molybdenum (Mo) films and silicon (Si) films stacked alternately.

There is no specific limitation on the method for attaching the filter windows 185 and 186. The filter windows 185 and 186 may be, for example, bonded with an adhesive or the like, or secured in the EUV exposure device mechanically.

The filter window 185 located between the light source 182 and the illumination optical system 183 captures scattered debris generated by the light source and prevents the scattered debris from adhering to a component in the illumination optical system 183 (e.g., the multi-layer mirrors 189).

The filter window 186 located between the illumination optical system 183 and the pattern plate 184 captures debris scattered from the light source 182 side and prevents the scattered debris from adhering to the pattern plate 184.

The foreign substance adhering to the pattern plate 184 absorbs or scatters the EUV light, and therefore, causes a resolution failure to the wafer. In order to avoid this, the pellicle 100 is attached to cover an area of the pattern plate 184 to be irradiated with EUV light. The EUV light is transmitted through the pellicle film 101 and is directed toward the pattern plate 184.

The EUV light reflected by the pattern plate 184 is transmitted through the pellicle film 101 and is directed toward the sensitive substrate 187 via the projection optical system 188.

The projection optical system 188 collects the light reflected by the pattern plate 184 and directs the light toward the sensitive substrate 187. The projection optical system 188 includes, for example, a plurality of multi-layer mirrors 190 and 191 adjusting the optical path of the EUV light.

The sensitive substrate 187 is, for example, a substrate including a semiconductor wafer and a resist coating the semiconductor wafer. The resist is cured as having a shape of a pattern by the EUV light reflected by the pattern plate 184. The resist is developed and the semiconductor wafer is etched, and as a result, a desired pattern is formed on the semiconductor wafer.

The pellicle 100 is attached to the pattern plate 184 via, for example, an adhesive layer for the pattern plate. The foreign substance adhering to the pattern plate absorbs or scatters the EUV light, and therefore, causes a resolution failure to the wafer. In order to avoid this, the pellicle 100 is attached to cover an area of the pattern plate 184 to be irradiated with the EUV light. The EUV light is transmitted through the pellicle film 101 and is directed toward the pattern plate 184.

The methods for manufacturing a pellicle film in preferred embodiments according to the present invention have been described. The above-described embodiments are merely examples, and the technological scope of the present invention is not limited to the above. A person of ordinary skill in the art would make various modifications without departing from the gist of the present invention defined by the claims. Therefore, such modifications are to be duly interpreted as being encompassed in the technological scope of the present invention.

According to each of the embodiments, a pellicle for EUV exposure that uses an adhesive but causes little outgassing, an exposure pattern plate, an exposure device, and a method for manufacturing a semiconductor device are provided. According to each of the embodiments, a pellicle may be provided in which outgassing is suppressed from being caused from the adhesive in a vacuum state where no EUV light is directed, contamination is suppressed from being caused in an area, of a space formed by the mask and the pellicle, that is irradiated with the EUV light, and the tolerance of the adhesive to the EUV light directed thereto is improved. In addition, this pellicle may be used to provide an exposure pattern plate capable of performing patterned exposure in which a resolution failure by a foreign substance is suppressed, an exposure device, and a method for manufacturing a semiconductor device.

What is claimed is:
1. A pellicle, comprising:
a pellicle film;
a support frame supporting the pellicle film; and a first adhesive layer provided at an end of the support frame, the end being opposite to an end on which the pellicle film is extended, wherein:

the pellicle further comprises an inorganic layer on a side surface of the first adhesive layer, the side surface extending in a direction crossing a surface of the pellicle film, and the pellicle film being extended on the side surface, and the inorganic layer has a mass absorption coefficient ($\mu_m$) in the range of $5 \times 10^3$ cm$^2$/g to $2 \times 10^5$ cm$^2$/g.

2. The pellicle according to claim 1, wherein the support frame includes a first frame connected with the pellicle film and a second frame connected with the first frame.

3. The pellicle according to claim 2, wherein the first frame and the second frame are connected with each other by a second adhesive layer, and the pellicle further includes a second inorganic layer on either one of side surfaces of the second adhesive layer, the side surfaces extending in the direction crossing the surface of the pellicle film.

4. The pellicle according to claim 1, wherein the inorganic layer, in the case of having a thickness of 400 nm, has a transmittance of 10% or lower to EUV (Extreme Ultraviolet) light having a wavelength of 13.5 nm.

5. The pellicle according to claim 1, wherein the inorganic layer has a thickness of 50 nm or greater.

6. The pellicle according to claim 1, wherein the inorganic layer is a metal layer.

7. The pellicle according to claim 6, wherein the metal layer is formed of one metal material selected from the group consisting of aluminum, titanium, chromium, iron, nickel, copper, ruthenium, tantalum and gold; an alloy containing two or more elements selected from the group; or an oxide containing two or more elements selected from the group.

8. The pellicle according to claim 1, further comprising a protective layer on an end surface of the first adhesive layer, the end surface being opposite to an end surface on which the pellicle film is formed.

9. An exposure pattern plate, comprising:

a pattern plate; and the pellicle according to claim 1 attached to a surface of the pattern plate, the surface having a pattern formed therein.

10. An exposure device, comprising the exposure pattern plate according to claim 9.

11. An exposure device, comprising:

a light source releasing exposure light;

the exposure pattern plate according to claim 9; and an optical system guiding the exposure light released from the light source to the exposure pattern plate, wherein the exposure pattern plate is located such that the exposure light released from the light source is transmitted through the pellicle film and is directed toward the pattern plate.

12. The exposure device according to claim 11, wherein the exposure light is EUV (Extreme Ultraviolet) light.

13. A method for manufacturing a semiconductor device, the method comprising:

causing exposure light, released from a light source, to be transmitted through the pellicle film of the exposure pattern plate according to claim 9 and to be directed toward, and to be reflected by, the pattern plate; and causing the exposure light, reflected by the pattern plate, to be transmitted through the pellicle film and to be directed toward a sensitive substrate, so that the sensitive substrate is exposed to the exposure light exposes so as to have a shape of a pattern.

* * * * *